United States Patent [19]
Clawson

[11] Patent Number: 4,671,847
[45] Date of Patent: Jun. 9, 1987

[54] THERMALLY-ACTIVATED VAPOR ETCHANT FOR INP

[75] Inventor: Arthur R. Clawson, San Diego, Calif.

[73] Assignee: The United States of America as represented by the Secretary of the Navy, Washington, D.C.

[21] Appl. No.: 799,228

[22] Filed: Nov. 18, 1985

[51] Int. Cl.[4] .................... H01L 21/02; C09K 13/00
[52] U.S. Cl. .................................. 156/635; 156/646; 252/79.1; 148/DIG. 119
[58] Field of Search .............. 156/635, 646, 662, 664, 156/903; 252/79.1; 148/DIG. 119

[56] References Cited

U.S. PATENT DOCUMENTS

| | | | |
|---|---|---|---|
| 3,366,520 | 1/1968 | Berkenblit et al. | 156/646 |
| 3,522,118 | 7/1970 | Taylor et al. | 156/646 |
| 3,855,024 | 12/1974 | Lim | 156/646 |
| 4,349,394 | 9/1982 | Wei | 148/175 |
| 4,397,711 | 8/1983 | Donnelly et al. | 156/646 X |
| 4,468,283 | 8/1984 | Ahmed | 156/642 |

FOREIGN PATENT DOCUMENTS

51-20973 6/1976 Japan .................................. 156/646

Primary Examiner—S. Leon Bashore
Assistant Examiner—Andrew J. Anderson
Attorney, Agent, or Firm—Robert F. Beers; Ervin F. Johnston; Thomas Glenn Keough

[57] ABSTRACT

Vapor from liquid ethylene dibromide (EDB) functions in a manner superior to anhydrous HCl for in situ gas phase etching of InP substrates in Metalorganic Vapor Phased Epitaxy (MOVPE). The etch rate and surface morphology behaviors have been determined for conditions useful as a substrate cleaning step prior to growth of InP and InGaAs epilayers. The thermally activated decomposition and etching are analogous to group III-V semiconductor growth processes; the behavior in different carrier gas mixtures demonstrates dependence on gas phase reactions in the heated vapor above the substrate.

17 Claims, 10 Drawing Figures

THERMALLY-ACTIVATED VAPOR ETCHANT FOR INP

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Successful growth of epilayers on InP single crystal substrates requires careful cleaning procedures to remove surface contaminants, oxides and mechanical damage. The specific procedures vary with the investigator and the epitaxial growth techniques; however, the substrate preparation steps typically include (1) chemomechanical polishing of the substrate surface to obtain a flat, damage-free growth interface, (2) chemical etch of interface oxides immediately prior to growth sometimes including removal of some depth of the InP to eliminate residual mechanical damage, and (3) an in situ etch of the surface in the growth chamber to provide a freshly exposed surface in the controlled growth environment. In the chloride and hydride vapor-phase growth techniques, surface etch conditions can be provided by the growth vapors before layer growth conditions are established. However, in metalorganic vapor-phase epitaxy (MOVPE) an etch-mode cannot occur from the growth constituents so a separate etchant species must be introduced.

The use of anyhdrous HCl has been reported in two relatively recent articles by M. Razeghi, M. A. Poisson, J. P. Larivain and J. P. Duchemin, in their article in *Journal of Electronic Materials* 12 (1983) page 371 and J. S. Whiteley and S. K. Ghandhi in their article appearing in *Journal of Electro Chemistry Society* 129 (1982) 383. This use of anyhdrous HCl is a necessary etchant step for successful MOVPE preparation of the alloy semiconductor InGaAs on InP. With in situ etching of the InP substrate it is possible to achieve specular layer surfaces. HCl however is a very difficult vapor to handle. The slightest traces of moisture accelerate corrosion of metal gas regulators, flow controllers, valves and tubing. Elastomer O-ring seals are particularly vulnerable to the cross-diffusion of HCl in the delivery lines with the water vapor outside. Frequently, the lifetime of HCl gas-controlled components is short. A hazard represented by the HCl is its 630 psig cylinder pressure and potential dispersion of the corrosive toxic gas into the environment should its pressure regulator fail.

A good alternative to etchants stored under high pressure is to pass a carrier gas through an etchant liquid whose vapor pressure is sufficient to provide a useful gas concentration. Vapor etching of GaAs substrates for MOVPE growth is reported with $AsCl_3$ as the etchant. A thorough discussion of this phenomena is set forth in the article by R. Bhat and S. K. Ghandhi, in the *Journal of the Electro Chemical Society* 124 (1977) 1447. The $AcCl_3$ decomposition provides a higher purity source of HCl and compressed anhydrous HCl. Decomposition of gaseous methyl bromide, $CH_3Br$ has been reported as photochemical etchant for GaAs and InP in the article by D. J. Ehrlich, R. M. Osgood and T. F. Deutsch appearing in *Applied Physics Letter* 36 (1980) 698. The gaseous methyl bromide should also be useful as a thermally-activated etchant; however, it has the disadvantage of a 1.83 atmosphere vapor pressure requiring a pressurized cylinder.

Thus there exists in the state-of-the-art a continuing need for an etchant for an indium phosphide substrate in the form of a readily available liquid having a convenient vapor pressure that lends itself for use at room temperature and is not overly corrosive, in non-flammable and doesn't react with moisture in air and further lends itself to being readily controlled.

SUMMARY OF THE INVENTION

The present invention is directed to providing a method for etching an InP semiconductor substrate to assure the removal of surface contaminants, oxides and mechanical damage. Ethylene dibromide is vaporized at a manageable vapor pressure and carried in a pure carrier gas at room temperature past a preheated substrate. Heating an InP substrate and flowing vaporized ethylene dibromide over it causes the etching of the substrate. A substrate temperature of greater than 650° C., and preferably 675° C. assures a satisfactory etching. Hazards are reduced with the safer ethylene dibromide.

A prime object of the invention is to provide an improved method of etching InP substrates.

A further object is to provide for an improved method for etching an InP substrate relying upon ethylene dibromide.

Still another object is to provide for an ethylene dibromide etchant adapted for cleaning InP substrates that avoid the problems associated with more highly corrosive etchants.

Still another object is to provide for an improved etchant of InP that reduces the problems associated with excessive pressures of etchants.

Still another object of the invention is to provide for an improved etchant of InP substrates that is nonflammable and does not react with ambient moisture.

Still a further object is to provide for an improved etchant operable in an atmospheric pressure reactor having gas flow rates that are controlled in a pure carrier gas ahead of a liquid source bubbler.

These and other objects of the invention will become more readily apparent from the ensuing specification when taken with the claims and the subject matter of the appended drawings.

DESCRIPTION OF THE PREFERRED EMBODIMENT

The essence of the invention relies upon the selection of an organic halide, ethylene dibromide, $CH_2BrCH_2Br$, (EDB) also called dibromo ethane, as an alternative halide etchant on the basis of a number of practical considerations. Ethylene dibromide, also known as glycol dibromide is a readily available liquid. It has a molecular weight of 187.88, a boiling point of 131.4° C., a specific gravity of 2.18, a vapor density of 6.5 (times air), a melting point of 9.3° C. and a vapor pressure at 20° C. of 12 mm of mercury. The vapor pressure makes it convenient for using the liquid at room temperature and it is much less corrosive at room temperature than HCl and HBr. It is non-flammable and doesn't react with moisture in air in an atmospheric pressure reactor the gas flow rates can be controlled in the pure carrier gas ahead of a liquid source bubbler.

It is important to bear in mind that ethylene dibromide in both the liquid and the vapor state are toxic so that appropriate handling procedures are used. As mentioned above it is non-combustible and at 20 ppm PEL, a permissible exposure limit average over an 8-hour work shift is tolerable. While a 50 ppm maximum peak exposure for 5 minutes during an eight hour work shift may be experienced without adverse reactions. Its odor is detectable above 10 ppm however there are poor warning properties. Ethylene dibromide is incompatible with the chemically reactive metals sodium, potassium, calcium, zinc, manganese and powdered aluminum. It is also imcompatible with liquid ammonia and strong oxidizers as well as the hazardous decomposition produced HBr, Br, and carbon monoxide. It will attack some plastics and rubbers and slowly decomposes when exposed to light. Human handlers of ethylene dibromide may experience blisters if the liquid contacts the skin and evaporation of it is delayed. Inhalation of ethylene dibromide fumes causes delayed pulmonary lesions and prolonged exposure may result in lever and kidney injury. It is suspected carcinogen. However, in view of the risks outlined above the use of ethylene dibromide as an etchant is less than some of the conventionally used alternatives.

Figure 1:
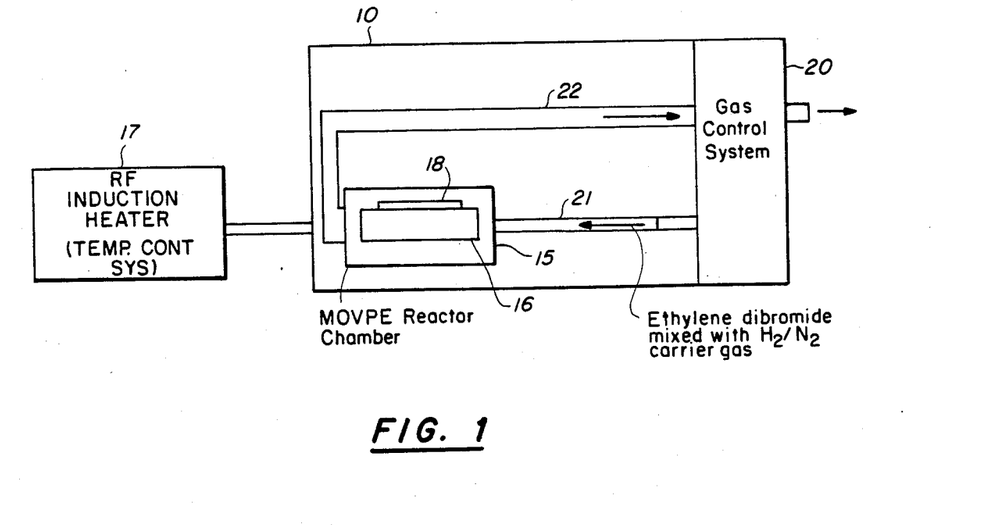
FIG. 1 sets forth a schematic representation of the apparatus associated with the improved method of etching InP substrates of this invention.

Referring now to FIG. 1 of the drawings the improved etchant is used in a standard MOVPE system having an enclosure 10 with transparent windows that contain MOVPE reaction chamber 15. The reaction chamber can be no more than a cylindrically shaped quartz container of sufficient size to contain a graphite susceptor slab 16 that is coupled to and RF induction heater 17. A temperature control system for the RF indiction heater is provided to assure that the susceptor heats a substrate 18 to the proper temperature for subsequent circuit building procedures. The substrate in this case is InP and as a condition prior to subsequent fabrication steps needs to have its surface etched clean to further assure the purity of reactive processes and to withstand the attendant temperature extremes which approach 1000° C. A gas controlled system 20 is used to control the pressure, temperature and volume of carrier gases such as nitrogen or hydrogen or combinations thereof along with the ethylene dibromide etchant. The carrier gases and ethylene dibromide are fed to the reactor chamber 15 via an appropriate fitting 21 which reaches from the gas control system to the chamber.

The MOVPE reactor chamber induction heater with temperature control system and gas control system are well established in the art to accomplish the MOVPE process. The gas control system additionally regulates the temperature, pressure and volume of arsine and phosphine, trimethyl indium, trimethyl gallium used to grow InP and InGaAs epilayers for a variety of semiconductors such as field effect transistors and photodetectors. The widely used systems are suitably modified to accommodate the ethyline dibromide in a manner to be disclosed below to improve the etching process without the risk attendant the use of the conventional etchants.

The introduction of ethyline dibromide vapor into the MOVPE reactor is achieved by use of a pyrex gas scrubbing bottle interconnected to the gas control system with stainless steel tubing and O-ring seals to the glass. Hydrogen or nitrogen gas controlled by a mass flow controller in the gas control system is bubbled through room temperature liquid EDB and transported to the reactor chamber. The pyrex gas scrubbing bottle tubing and seal were not shown and were grouped in the gas control system since such expedients are well known in the art and their inclusion here would only belabor the obvious.

A series of runs has been made to determine the etchant behavior of EDB on polished pieces of (100)-oriented, FE-doped InP to characterize temperature dependence, EDB concentration dependence, total gas flow dependence, time dependence, and dependence on the species of the carrier gas. Polished substrates were cleaned before use with potassium hydroxide for ten minutes or longer followed by a 1-minute 1% bromide/methanol etch, a methanol rinse than blown dry and filtered nitrogen gas. The substrates are immediately weighted and placed in the MOVEP chamber. The etching conditions using the ethylene dibromide were monitored over a range of temperatures and gas flow conditions similar to those used for epilayer growth. The reactor chamber 15 is a horizontal $1'' \times 1''$ cross-section tube with a $\frac{1}{4}''$ high $\times 1''$ wide $\times 1\frac{1}{2}''$ long graphite susceptor 16 resting on the bottom. RF induction heating from heater 17 is used with a thermo couple inserted in the susceptor to control the temperature. All gases are controlled with mass flow controllers in an all stainless steel distribution system 20. In the carrier gases hydrogen is palladium purified and the nitrogen is from vaporized $LN_2$. The exhaust gases from reactor pass through a duct 22 that feeds the exhaust gases through activated charcoal to remove organic and hydride resitual vapors.

The etching times are typically about 5 minutes; the total gas flow is about 2 SLM (gas velocity in the cold portion of the chamber of 5.2 cm per second); and temperatures span from 400°–750° C. with most of the results at 650° C. A partial pressure of $PH_3$ was used to inhibit InP thermo decomposition. The two major results examined for optimized performance are the etch rate and the surface morthology.

The etch rate is determined by the weight-loss of the InP substrate 18 using an analytical balance with 1-microgram resolution. The InP used to verify this concept consisted of various-sized small scraps with (100) surface areas of 15-30 square millimeters. To estimate the thickness removed by the etchant the loss from the substrate edges also was considered. For those small pieces the edges composed approximately 30% of the exposed InP surface. The thicknesses removed was determined by assuming no weight loss from the substrate surface in contact with the graphite susceptor, and assuming the etch rate of the (110) edges to be the same as the (100) polished surface.

Figure 2:
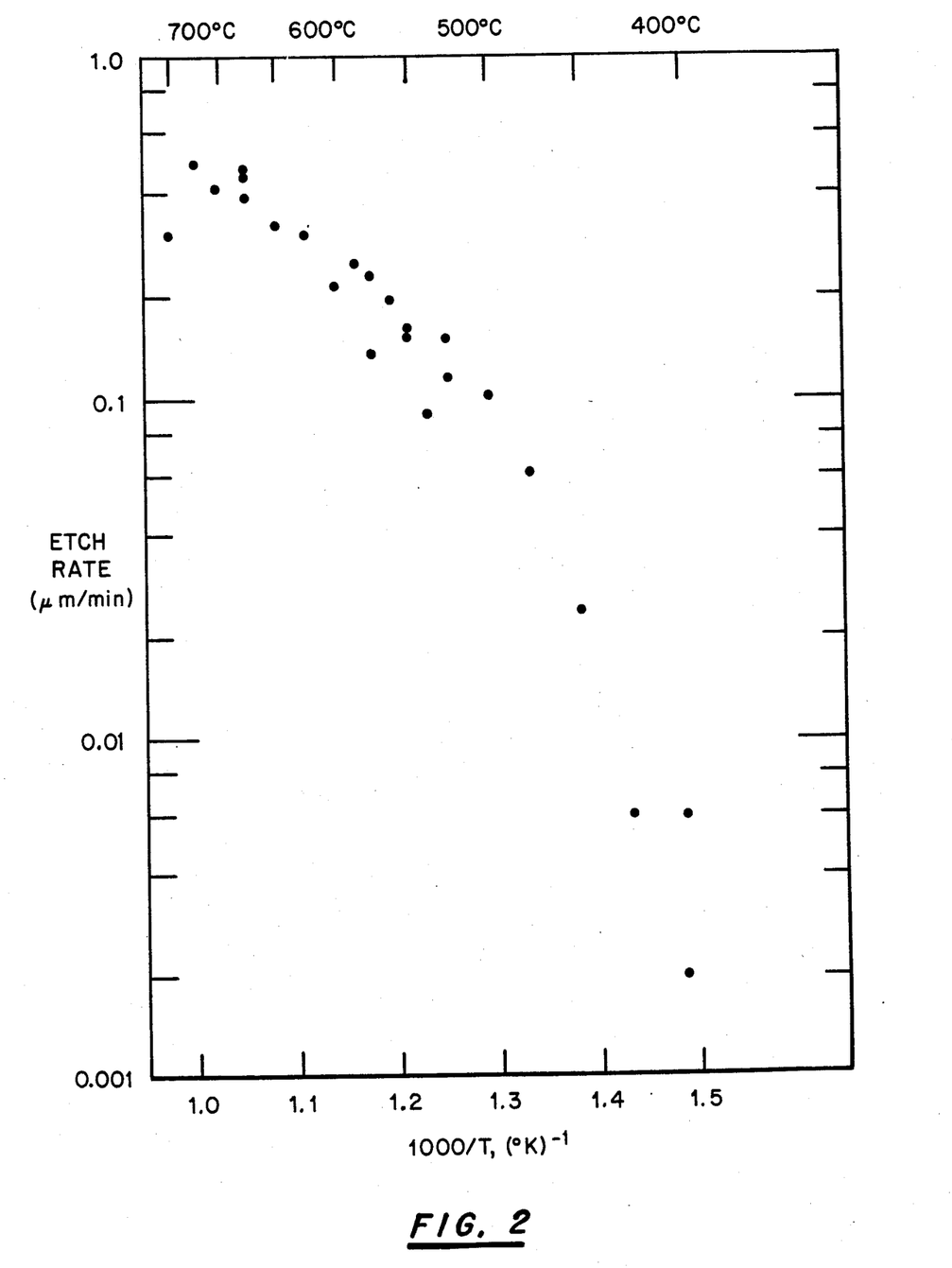
FIG. 2 is a depiction of InP (100) EDB etch-rate temperature-dependence in $H_2$ carrier gas.
Figure 3:
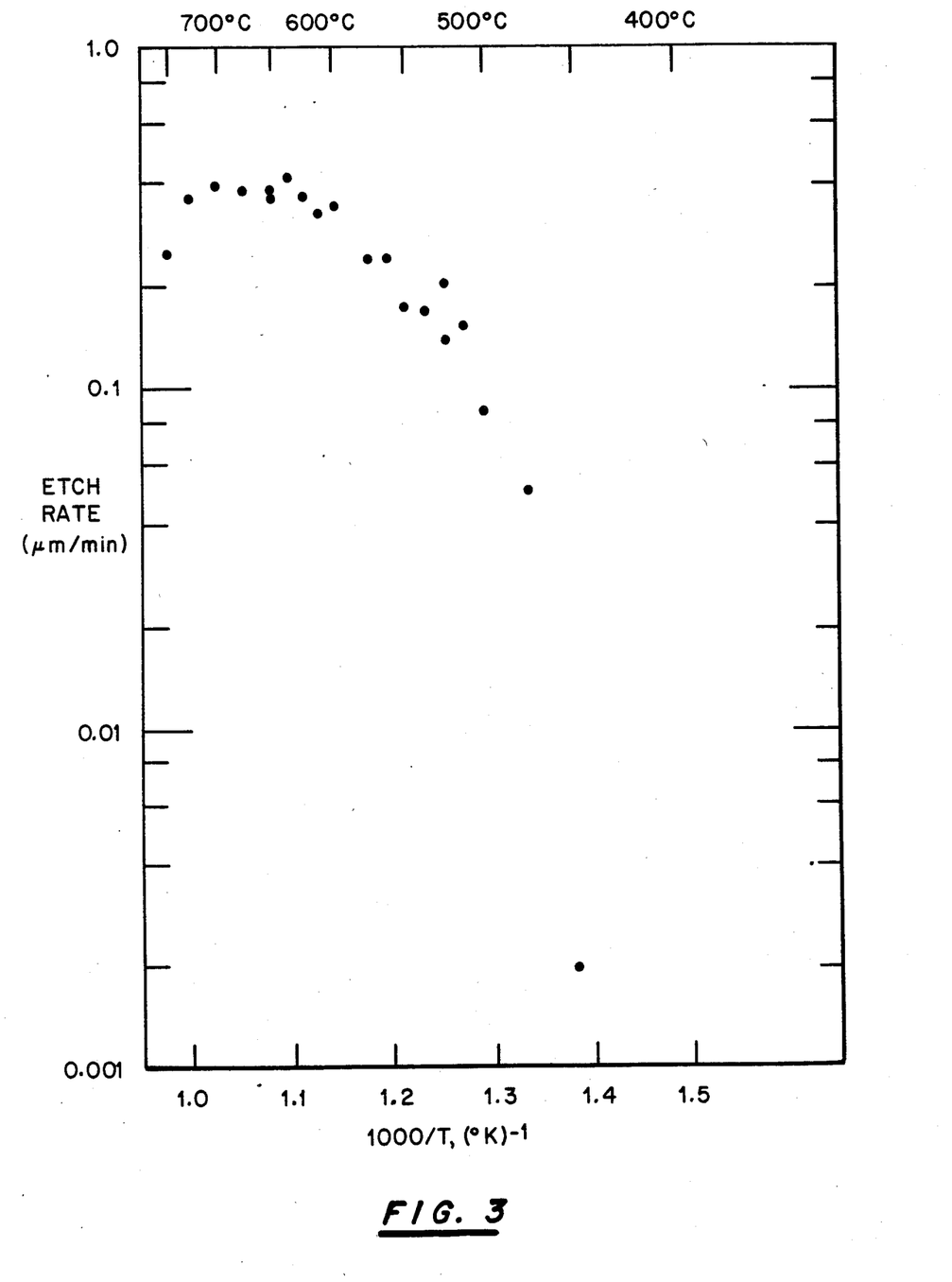
FIG. 3 is a representation of InP, 3-off (100) toward (110), EDB etch-rate temperature-dependence in $H_2$ carrier gas.
Figure 4:
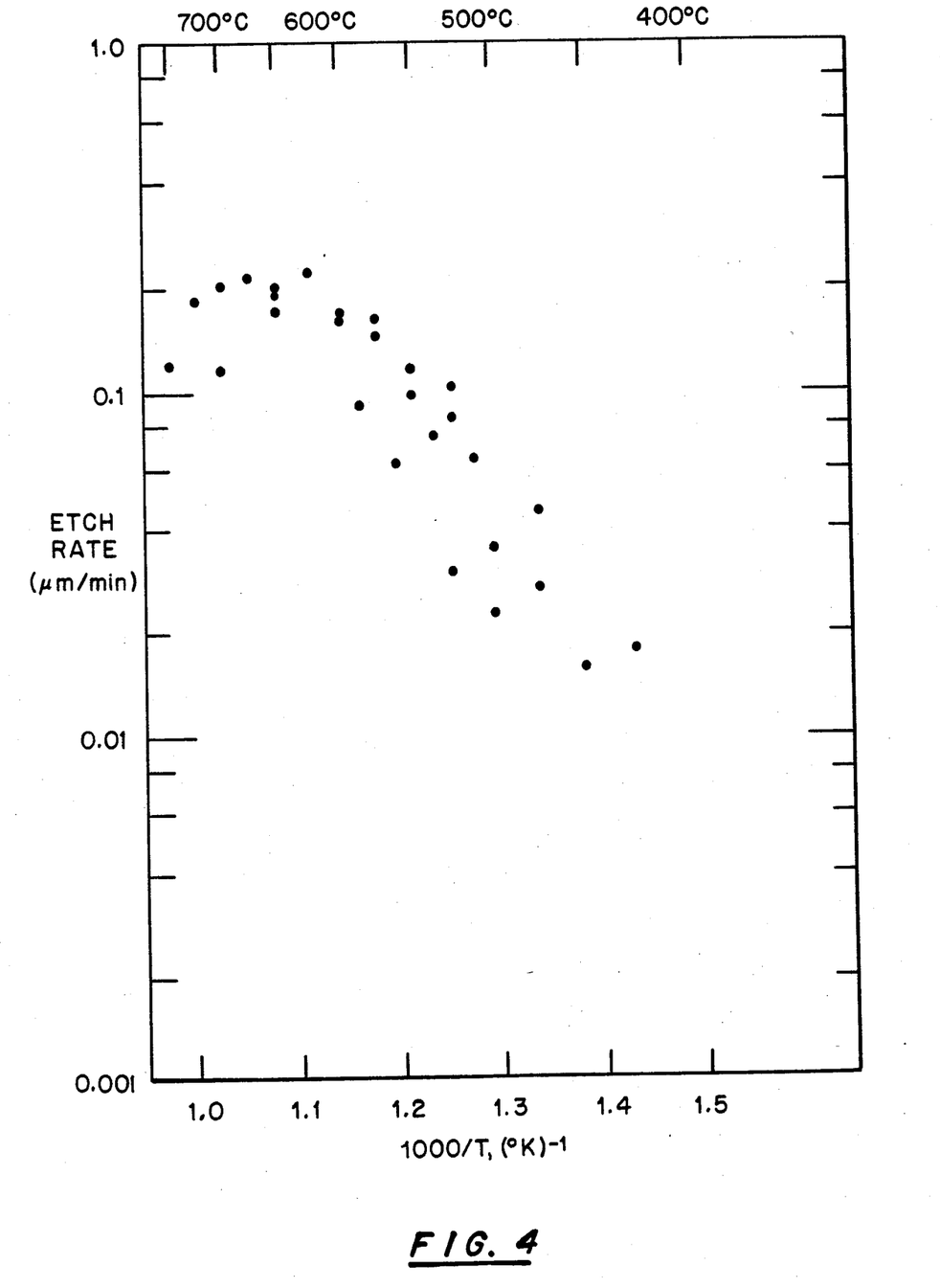
FIG. 4 shows InP (100) EDB etch-rate temperature-dependence in 25% of $H_2$ plus 75% $N_2$ carrier gas.
Figure 5:
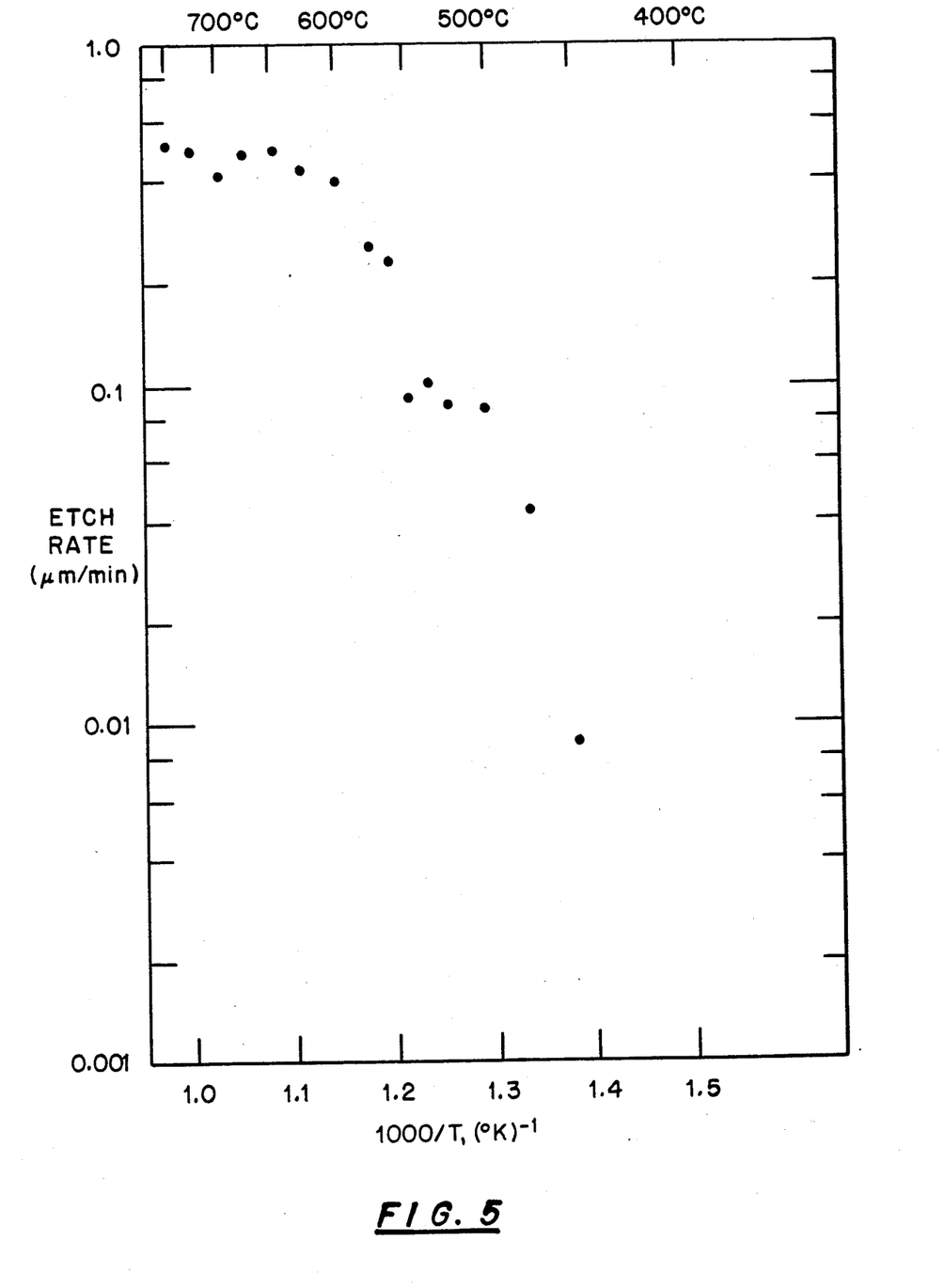
FIG. 5 is a depiction of InP (100) EDB etch-rate temperature-dependence in 25% $H_2$ plus 75% He carrier gas.

The temperature dependence of etch rate for EDB-InP vapor etching is apparent by a series of runs with all parameters but temperature constant. The exception to this was an increase in $PH_3$ concentration at high temperatures to prevent surface degradation. It was determined however, that the etch rate data is independent of $PH_3$ fraction. The etch time was consistently five minutes. The EDB concentration $1.3 \times 10^{-4}$ atm. The total gas flow 2 SLM and the $PH_3$ concentrations $5.5 \times 10^{-3}$ atm. or greater. The etch rate temperature dependence has been determined for four different conditions. FIG. 2 shows the log of the etch rate vs. reciprocal absolute temperature for (100) oriented InP in $H_2$ carrier gas. FIG. 3 shows the similar data for 3° -off (100) toward (110)-oriented InP in $H_2$ carrier gas; and FIGS. 4 and 5 show rate data for (100) InP in 25% $H_2$ + 75% $N_2$ and 25% $H_2$ and 75% He, respectively. The log rate vs. 1/T format is usual for thermally activated processes and is used here for easy comparison with other etching and growth processes on III-V materials. The data are virtually identical for both (100) and 3° -off (100) InP in $H_2$ carrier gas; and the qualitative dependence on temperature is the same in gas mixtures of $H_2$ with He and $N_2$.

The EDB etch rate temperature dependence is similar to both etching and growth behavior of GaAs. These phenomena were predicted in the above cited articles in the *Journal of Electro Chemical Society* 124 (1977) 1447 and *Applied Physics Letters* 36 (1980) 698. The exponential increase of rate with temperature below 500° C. is typical of a surface process under kinetic control; and the apparent activation energy of 38 K cal/mo is tyupical of such processes, D. W. Shaw "Mechanisms in Vapor Epitaxy of Semiconductors" *Crystal Growth Theory and Techniques* Vol. I Ed. C. H. L. Goodman (Plenum Press, London, 1974). A further argument for control of the etch by surface kinetics at the lower temperatures is seen in the temperature dependence of (100) morphologies. For $H_2$ carrier gas the etch pits at 550° C. and lower have distinct crystallographic orientation and faceting typical of etch rates limited by the surface kinetics.

For the 700° C. to 750° C. range where etching is mass transport limited the rate is controlled by processes away from the substrate surface. The insensitivity to crystal surface chemistry reduces the etch pit formation however, at these temperatures a degree of thermal pitting occurs regardless of increased $PH_3$ concentrations. For the 575° C. to 600° C. regime the etch pits are seen to be shallow and less defined by crystallographic facets. The absence of strong crystallographic dependence weakens any argument that this regime is dominated solely by surface kinetic processes. Also there are some specimens etched in this regime which showed absence of etch pits. The edges of samples which correspond to the outer edge of the polished wafer typcially are free of pits. The outer surface of the wafer has been polishd and etched more than the central region, and as a result, the surface is slightly curved so it is no longer parallel to (100). The use of substrates oriented 3° -off (100) toward (110) results in dramatic reduction in etch pit features with no difference in the etch rate. The improved etch morphology is consistent with observed improvement in CVD III-V layer morphology when substrates are misoriented two or three degrees from (100), see the A. E. Blakeslee, "Effects of Substrate Misorientation in Epitaxial GaAs", *Transactions of the Metallurgical Society AIME* 245,577 (1969).

The dramatic effecxts of surface orientation may explain observed morphology variations for some samples etched under identical conditions. The remaining data discussed below are for nominally (100) InP surfaces, however, the exact orientations used in this study were not controlled. This introduces an element of caution in interpreting anomolies in the morphology data presented in the figures.

Figure 6:
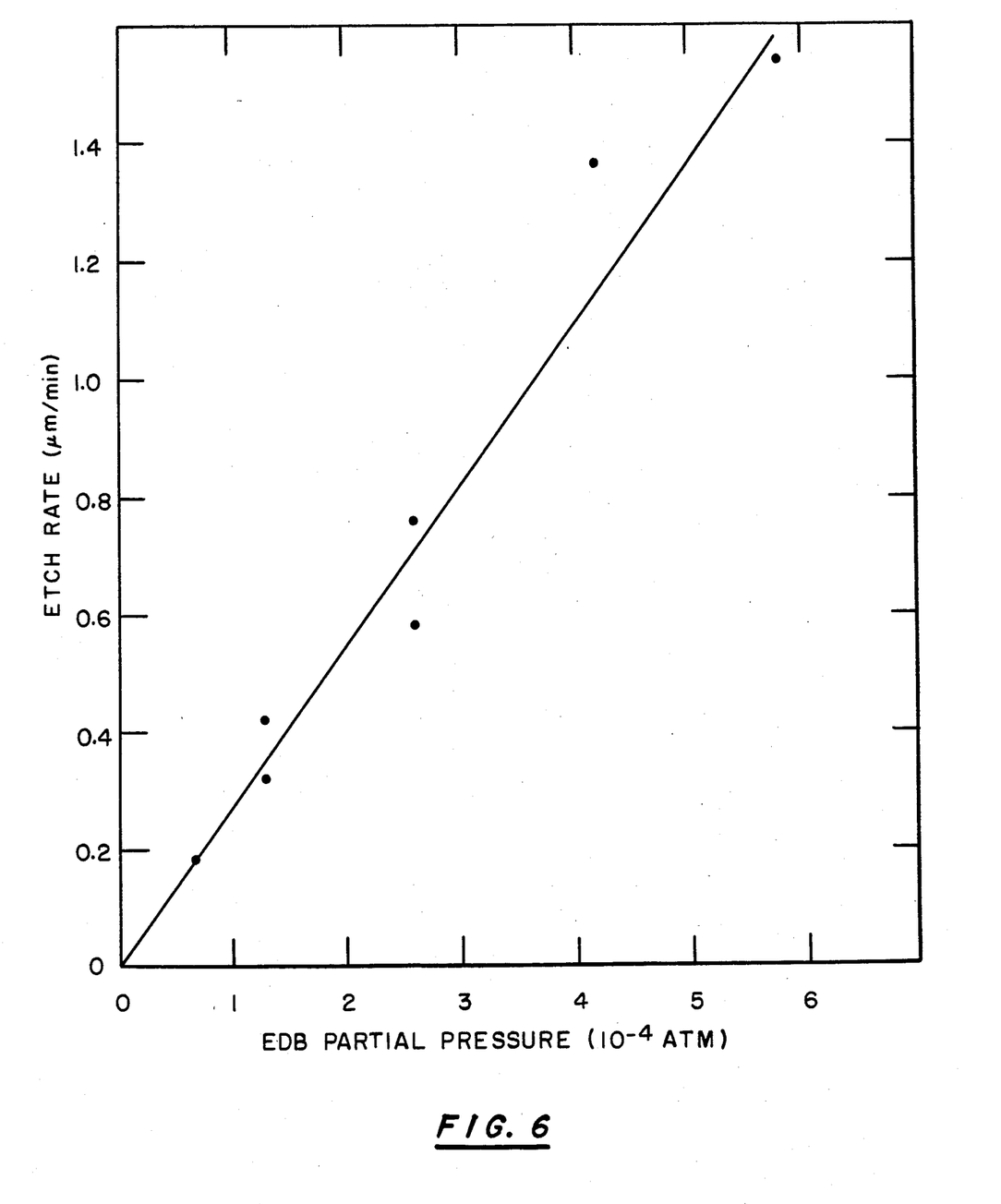
FIG. 6 shows InP (100) etch-rate dependence on the concentration of ethylene dibromide (EDB) vapor in $H_2$ carrier gas. Total gas flow = 2 SLm; time = 5 minutes; t = 650° C.; $PH_3 = 5.5 \times 10^{-3}$ atm.

The dependence of etch rate on EDB concentration is shown in FIG. 6. The EDB concentrations were determined by the flow rate of $H_2$ carrier gas at rates from 0-100 sccm (i.e., vapor pressures up to $6.5 \times 10^{-4}$ atm). Within this range the etch rate is linear with concentration. The severity of surface pitting increases with concentration. This is attributed to the etchant concentration rather than the depth of the etch since it has been noted that deeper etches, by using long times and slow rates, show smoother surfaces. Apparently increasing the EDB concentration overcomes the boundary layer diffusion limits so that the etch process becomes more controlled by surface kinetics, thus the increased pitting.

Figure 7:
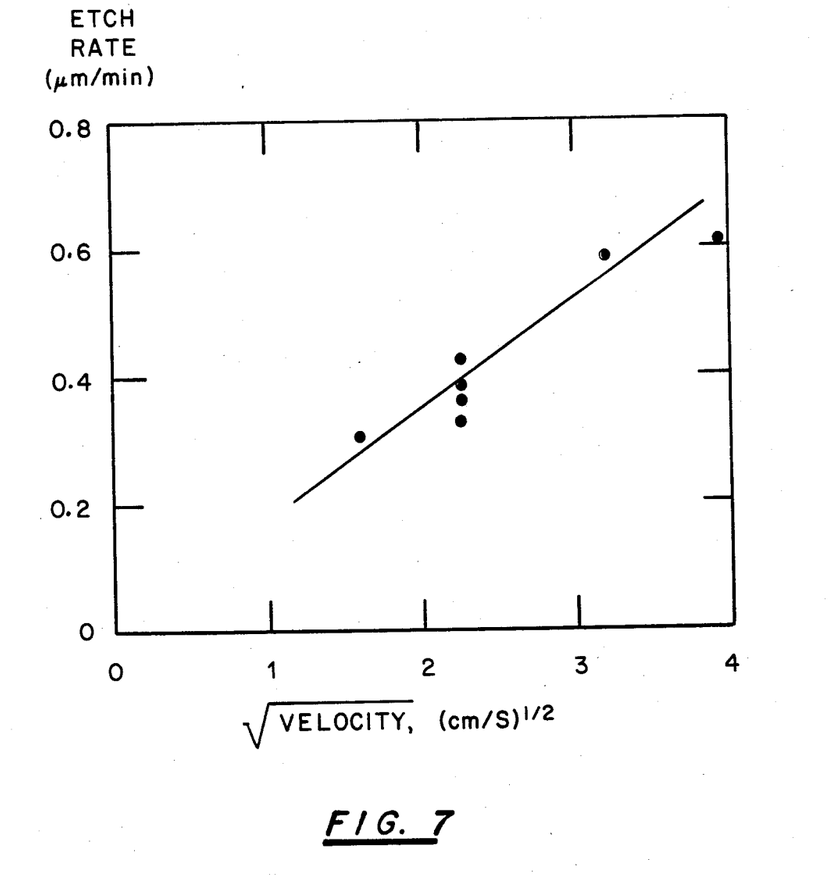
FIG. 7 shows InP (100) EDB etch-rate dependence as a function of the square-root of the $H_2$ carrier gas velocity. Gas flows range from 1 to 6 SLM; partial pressures of the reactants are maintained constant; $EDB = 1.3 \times 10^{-4}$ atm.; $PH_3 = 5.5 \times 10^{-3}$ atm.

The effect of gas velocity on the EDB etching was assessed by increasing the total flow with the partial pressures of the EDB and $PH_3$ held constant. In th confines of a fixed geometry chamber this is equivalent to increasing the velocity of a gas of constant composition. The etch rate for diffusion-controlled mass transport should, according to E. C. Eversteyn, P. S. Severin, C. H. J. van der Brekel and H. L. Peak in "A Stagnant Layer Model for the Epitaxial Growth of Silicon from Silane in a Horizontal Reactor" *Journal of the Electro Chemical Society* 117,925 (1970) be proportional to the square root of the velocity corresponding to a reduction in the stagnant "boundary layer" at the InP surface. The data of FIG. 7 indicates this general behavior. A departure of the square root dependence at high velocities is expected because conditions are approached where the boundary layer becomes thin and kinetic processes again influence the etch rate. These data seem to confirm that in FIGS. 2-5 at 600° C., the rates are primarily diffusion controlled with a velocity dependent boundary layer thickness. No difference in the surface morphologies was observed for the change in gas velocity.

Figure 8:
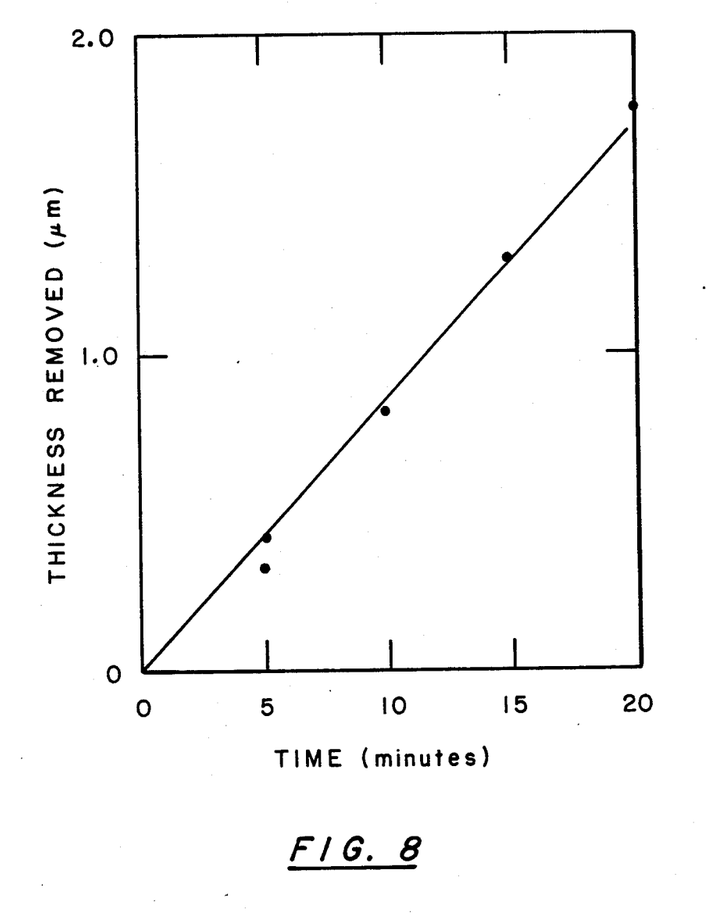
FIG. 8 shows InP (100) EDB etch-rate dependence on time.

The dependence of EDB etch rate on time in $H_2$ carrier gas is shown in FIG. 8 to be linear and no significant changes in surface morphology with time were observed over the range of temperature from 400° to 750° C. The etch pit characteristics do not change, although the surface roughening increases.

Figure 9:
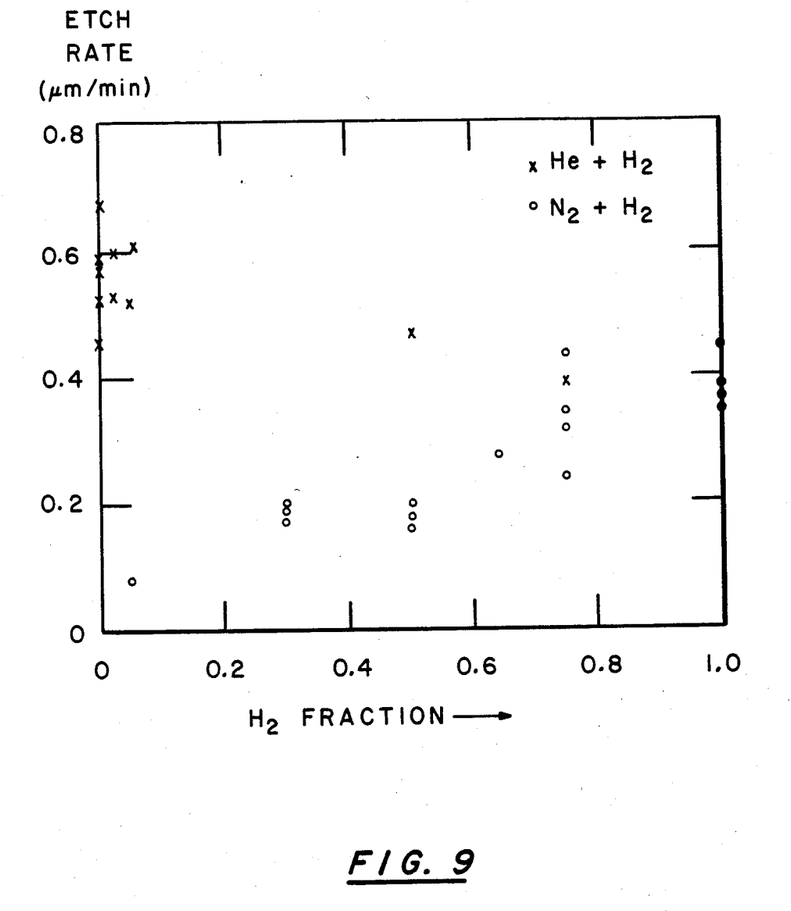
FIG. 9 is a depiction of InP (100) EDB etch-rate dependence on carrier gas species for mixtures of hydrogen with nitrogen and helium. Total gas flow = 2 SLM; $EDB = 1.3 \times 10^{-4}$ atm.; $T = 650°$ C.; $PH_3 = 5.5 \times 10^{-3}$ atm.

The introduction of nitrogen and helium as a fraction of the carrier gas shows a definite influence on the etch rate as seen in FIG. 9. Thermal conductivity and its effect on temperature gradients and the volume of heated gas over the susceptor are of major importance;

however, it is also apparent that the gas phase kinetic equilibrium and/or the vapor/solid surface kinetics would be changed by reduction of $H_2$ partial pressure. No dramatic changes in the surfaces are observed; however, comparison of morphologies for the gas compositions shows some subtle differences.

Phosphine was necessary in some minimum concentration to maintain smooth surfaces. The etch rates of EDB, however, are independent of the $PH_3$ concentration, even for cases where the surface showed severe thermal degradation. This insensitivity to the phosphorus suggests that it is the action of the etchant in the In that limits the rates. Insufficient $PH_3$ was evident from the presence of uniformly distributed pits and In droplets or more severe roughening. The minimum $PH_3$ partial pressures found necessary for good InP surfaces in a 2 SLM total gas ($H_2$ flow) at 650° C. $PH_3$ is at $5.5 \times 10^{-3}$, at 675° C. $PH_3$ is at $1.10^{-2}$ atm, for 700° C. $PH_3$ is $1.38 \times 10^{-2}$, at 725° C. $PH_3$ is 1.67 at $10^{-2}$ and at 750° C. $PH_3$ is at $2.20^{-2}$ atm. For all temperatures below 650° C. the $PH_3$ was maintained at $5.5 \times 10^{-3}$ atm, at temperatures 700° C. and above the surfaces have a distribution of fine thermal etch pits regardless of how much $PH_3$ is introduced.

An analogy between the etchant behavior on InP substrates is made to growth behavior. Etching times are about 5 minutes compared to about 30 minutes or longer for layer growth, the growth chamber walls stay clean and the etchant is much cheaper than the metal alkyls used for MOVPE. Etching also provides information for optimizing the surfaces on which layers are to be grown, and by inference, the behavior of the vapor/solid interactions expected during growth.

A general description of vapor-phase growth/etching in open flow systems as a sequence of process steps has been outlined in the above cited article by Shaw appearing in *Crystal Growth and Techniques*. The process rates are controlled by (1) the supply of reactants into the chamber, (2) the mass transfer of these reactants and their byproducts to and from the vapor stream to the substrate surface, and (3) the kinetics of the reactions at the substrate surface. Whichever of these steps is slowest will control the process rate.

In pyrolytic deposition techniques, such as used in silicon layer growth and in III-V MOVPE layer growth, the reactant gases are introduced and transported at room temperature in a cold wall quartz chamber. Decomposition and reaction of the gases occurs by thermal activation from the heated substrate and its supporting susceptor. Deposition by pyrolysis is frequently modeled simply as a non-equilibrium surface reaction with the rates controlled by the surface kinetics limited under some conditions by the diffusion of the vapors across a stagnant boundary layer. It is realistic to consider that at least some input gas species will decompose in the heated vapor space above the susceptor as well as at the substrate surface, and the rate limitations can result from the gas phase reactions as well. The vapor/solid interface interaction would include a whole family of generated vapor species in quasi-equilibrium and the growth or etching is driven by departure of equilibrium of the vapor with the solid.

An analysis of pyrolytic growth based solely on calculated thermo-dynamic vapor equilibrium and gas flow hydrodynamics (exclusive of surface kinetics) has been modeled for silicon growth from silane by Coltrin et al, see "Mathematical Model of the Coupled Fluid Mechanics and Chemical Kinetics in a Chemical Vapor Deposition Reactor" above appearing in *Journal of the Electro Chemical Society* 131,425 (1984). The article assumes that the reaction zone is in the vapor with the rates controlled by the gas-pase kinetic processes. In this anslysis the coupled fluid mechanics and chemical kinetics predict the gas-phase temperature, velocity and chemical species concentration profiles; the deposition rates agree with experimental results.

An important feature of the Coltrin et al article is that the calculations demonstrate the rate dependence on gas conductivity. The vapor etch behavior of EDB on InP is consistent with predictions of this model. If the EDB etch rates are controlled by gas-phase decomposition, then the shape and position of the reaction zone will be determined by both heat transfer away from the susceptor and mass transfer processes in the gas phase. For nitrogen carrier gas the volume of heated gas above the susceptor will be much smaller than the hydrogen or for helium because of the much lower thermal conductivity. The etch rate dependence on gas species in FIG. 9 is consistent with this behavior. The EDB etch rate appears to be related to the extent of the gas phase reactions. As the heated zone volume increases by using $H_2$ or He gas, more reactant is available from decomposed EDB. The increased dimensions of the zone do not cause problems for mass transfer of the reactant because the gas diffusivity behavior is identical to the thermal diffusivity responsible for establishing the greater reaction zone volume. The gas phase kinetic process will likely depend on the hydrogen partial pressure and may explain the increase in etch rate as helium is introduced.

Comparison of the etch rate temperature dependence data of FIG. 2 for $H_2$ carrier gas with FIG. 4 for 25% $H_2$ and 75% $N_2$ shows the rate dependences to be consistently a factor of two different over the entire temperature range. The effect of different carrier gas is to change the supply of reactant accessible to the InP surface from the gas phase. The temperature dependence of the etch-rates is unchanged. Both kinetic and diffusion rate-controlled regimes are expected to show first order dependence on the etchant concentration.

The scatter in etch rate data obscures the exact shape of the curves in FIGS. 2, 3, 4, and 5; however, the general trends are consistent. Some of the scatter results from arbitrary differences in shapes and sizes of the InP specimens. The data of FIG. 5, however, were taken on nearly identical pieces of InP. From these more consistent data a distinct plateau in the etch-rate temperature-dependence is seen from 500° C. to 550° C. This suggests that there may be two different activated processes that contribute to the etching, one below 500° C. and the other dominating the etch above 550° C. There is a hint of this plateau in $H_2$ carrier gas of FIGS. 2 and 3; however, in the $H_2$ and $N_2$ carrier gas of FIG. 4, the scatter is too great to tell. The tube geometry and gas velocities were chosen to provide lamillar flow which is the simplest flow configuration to analyze since convective flow is limited parallel to the substrate and the mass transport to and from the gas stream is by diffusion. The rectangular tube cross-section with heating at the bottom is a stable configuration for lamellar flow with sufficiently high gas velocities, as demonstrated by L. J. Giling. in "Gas Flow Patterns in Horizontal Epitaxial Reactor Cells Observed By Interference Holography" *Journal of the Electro Chemical Society* 129,634 (1982). It has been reported however that the flow for lower conductivity $N_2$ and Ar is much less stable than for $H_2$ and He. The increased scatter in etch data for H$_2$ and N$_2$ is likely due to convective instabilities perturbing the uniform distribution of etchant.

Figure 10:
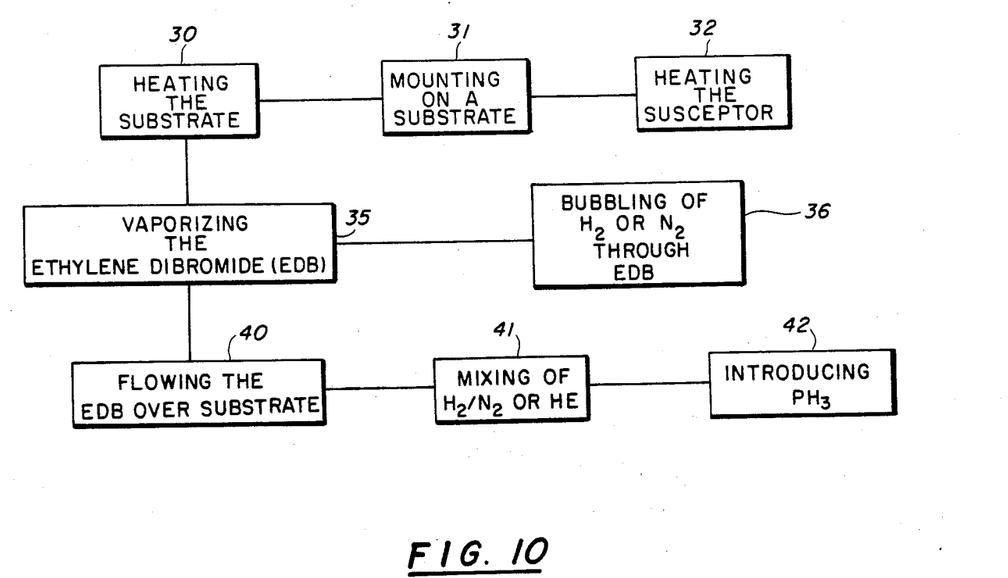
FIG. 10 shows the improved method of etching employing ethylene dibromide vapors.

Referring to FIG. 10 of the drawings there is seen the improved process in method for etching an InP substrate to assure the removal of surface contaminants, oxides and mechanical damage. Heating 30 the InP substrate and the vaporizing 35 of ethylene dibromide and the subsequent flowing 40 of the vaporized ethylene dibromide over the heated InP substrate assures the etching thereof. Mounting 31 the substrate on a susceptor and heating 32 the susceptor assures that the InP substrate is heated to a temperature of 650° C. or preferably to a temperature of 675° C. The step of vaporizing includes the bubbling 36 of hydrogen or nitrogen through the EDB. The step of flowing includes the mixing 41 of H$_2$/N$_2$ or helium with the vaporized EDB. Optionally introducing 42 PH$_3$ prevents surface degradation.

Obviously many modifications and variations of the present invention are possible in the light of the above teachings. It is therefore to be understood that within the scope of the appended claims the invention may be practiced otherwise than as specifically described.

What is claimed is:

1. A method for etching an InP substrate to assure the removal of surface contaminants, oxides and mechanical damage comprising:
   heating the InP substrate;
   vaporizing ethylene dibromide; and
   flowing the vaporized ethylene dibromide over the heated InP substrate to assure the etching thereof.

2. A method according to claim 1 further including: mounting the InP substrate on a graphite susceptor having a thermocouple that is coupled to an RF induction heater to assure the heating of the InP substrate.

3. A method according to claim 2 in which the step of heating includes:
   heating of a graphite susceptor and mounted InP substrate by an RF induction heater connected to a thermocouple in the susceptor to a temperature in excess of 650° C.

4. A method according to claim 3 in which the step of heating is to a temperature of 675° C.

5. A method according to claim 4 in which the etching of the InP substrate depends on gas-phase reactions in heated vapor above the InP substrate during the step of flowing.

6. A method according to claim 5 in which the step of flowing includes the mixing of the ethylene dibromide with a mixed H$_2$ and N$_2$ carrier gas.

7. A method according to claim 6 further including:
   introducing a PH$_3$ concentration into flowing ethylene dibromide to prevent surface degradation.

8. A method according to claim 7 in which the ethylene dibromide has a concentration of about $1.3 \times 10^{-4}$ atm. at a total gas flow of 2 SLM with a PH$_3$ concentration of about $5.5 \times 10^{-3}$ atm.

9. A method according to claim 5 further including:
   introducing a PH$_3$ concentration into flowing ethylene dibromide to prevent surface degradation.

10. A method according to claim 5 in which an H$_2$ carrier gas is provided.

11. A method according to claim 5 in which a carrier gas of 25% H$_2$ and 75% N$_2$ is provided.

12. A method according to claim 5 in which a carrier gas of 75% H$_2$ and 25% N$_2$ is provided.

13. A method according to claim 5 in which a carrier gas of N$_2$ is provided with He added to influence the rate of etching.

14. A method according to claim 1 in which the rate of etching is dependent of the rate of the step of flowing.

15. A method according to claim 1 further including:
    introducing phsophine into the flowing of ethylene dibromide to maintain smooth surfaces.

16. A method according to claim 1 in which the step of vaporizing includes the bubbling of H$_2$ gas through room temperature ethylene dibromide prior to the step of flowing.

17. A method according to claim 1 in which the step of vaporizing includes the bubbling of N$_2$ gas through room temperature ethylene dibromide prior to the step of flowing.

* * * * *